United States Patent [19]

Kita

[11] Patent Number: 4,596,071

[45] Date of Patent: Jun. 24, 1986

[54] METHOD OF MAKING SEMICONDUCTOR DEVICES HAVING DIELECTRIC ISOLATION REGIONS

[75] Inventor: Akio Kita, Tokyo, Japan

[73] Assignee: Oki Electric Industry Co., Ltd., Tokyo, Japan

[21] Appl. No.: 640,833

[22] Filed: Aug. 15, 1984

[30] Foreign Application Priority Data

Sep. 5, 1983 [JP] Japan ............................... 58-161895

[51] Int. Cl.$^4$ ............................................ H01L 21/76
[52] U.S. Cl. .................................... 29/576 W; 29/580; 29/578; 29/571; 29/591; 148/1.5; 357/55; 357/40; 156/643; 156/648; 156/649; 156/659.1
[58] Field of Search ................. 29/571, 576 B, 576 W, 29/578, 591, 577, 580; 148/1.5, 175; 357/55, 40; 156/643, 648, 649, 659.1

[56] References Cited

U.S. PATENT DOCUMENTS

| | | | |
|---|---|---|---|
| 4,101,350 | 7/1978 | Possley et al. | 29/576 W X |
| 4,307,180 | 12/1981 | Pogge | 29/576 W X |
| 4,338,138 | 7/1982 | Cavaliere et al. | 29/576 W X |
| 4,505,025 | 3/1985 | Kurosawa et al. | 29/576 W |

FOREIGN PATENT DOCUMENTS 0018426  2/1981  Japan ................. 29/576 W 1208578  10/1967  United Kingdom .

OTHER PUBLICATIONS

*Solid–State Science and Technology* "A Method for Area Saving Planar Isolation Oxides Using Oxidation Protected Sidewalls" Nov. 1980.

*Primary Examiner*—Brian E. Hearn
*Assistant Examiner*—David A. Hey
*Attorney, Agent, or Firm*—Wenderoth, Lind & Ponack

[57] ABSTRACT

A method of making semiconductor devices having fine dielectric element isolation regions is disclosed. The method comprises the steps of preparing a semiconductor substrate of one conductivity type which is in a high impurity concentration; forming on the surface of the semi-conductor substrate an epitaxial layer having the same conductivity type as that of the semiconductor substrate in a low impurity concentration; etching off selected regions of the epitaxial layer so as to form islands of the epitaxial layer; forming a CVD oxide layer all over the surface of the structure obtained by the steps; applying high-molecular material film all over the surface of the oxide layer; and removing both the oxide layer and the high-molecular material film so as to expose the surface of the islands, whereby fine element isolation regions of the oxide layer are obtained between the islands.

6 Claims, 8 Drawing Figures

METHOD OF MAKING SEMICONDUCTOR DEVICES HAVING DIELECTRIC ISOLATION REGIONS

BACKGROUND OF THE INVENTION

This invention relates to a method of making semiconductor devices having fine dielectric element isolation regions.

A selective oxidation process has been widely used as useful means for making dielectric isolation regions. This process, for example, is disclosed by Japanese Patent Publication No. 17069/1975. FIGS. 1a to 1c shows the typical steps of making dielectric isolation regions for MOS IC semiconductor devices.

In FIG. 1a, silicon oxide film 11 is thermally grown on the surface of a silicon semiconductor substrate 10, and then a silicon nitride film 12 is formed on the surface of the oxide film 11 by a chemical vapor deposition (CVD) process.

Next, the silicon nitride film 12 is selectively etched off to form oxidation-resistant masks 14. Channel stop regions 13 are formed in the surface of the silicon substrate 10 by ion-implanting, e.g. boron atoms through the exposed surface of the oxide film 11 (see FIG. 1b).

Thereafter, with the oxidation-resistant masks 14, the structure obtained is heated in a wet oxygen atmosphere, so that thick field oxide regions 15 as an element isolation having a thickness of 300–1000 nm is formed (see FIG. 1c). After removing the oxidation-resistant mask 14, MOS transistor elements, for example, are formed in the active regions 16.

However, the conventional process described above has disadvantages in that the thermally grown oxide invades the silicon substrate under the oxidation-resistant masks 14 to form so-called bird's beak regions 17, making it difficult to accurately control the sizes of field regions 15 and active regions 16. Furthermore, during the heat oxidation process, the channel stop regions 13 widen through outer diffusion, so that the effective gate width of the MOS transisor is narrowed which degrades the transconductance (gm) of the MOS transistor. Therefore, it is difficult to miniaturize the sizes of active regions.

SUMMARY OF THE INVENTION

Accordingly, it is an object of this invention to provide a method of making semiconductor devices which include dielectric element isolation regions with no bird's beak regions.

It is another object of this invention to provide a method of making semiconductor devices including fine element isolation regions.

According to an aspect of this invention, is provided a method of making semiconductor devices comprising the steps of: preparing a semiconductor substrate of one conductivity type which is in a high impurity concentration; forming on the surface of the semiconductor substrate an epitaxial layer having the same conductivity type as that of the semiconductor substrate in a low impurity concentration; etching off selected regions of the epitaxial layer so as to form islands of the epitaxial layer; forming an oxide layer all over the surface of the structure obtained by the steps; applying high-molecular material film all over the surface of the oxide layer; and removing both the oxide layer and the molecular material film so as to expose surfaces of the islands, whereby fine element isolation regions of the oxide layer are obtained between the islands.

The above and other objects, features and advantages of the invention will be more apparent from the ensuing detailed description taken in conjunction with the accompanying drawings.

DESCRIPTION OF THE PREFERRED EMBODIMENT

In this embodiment, a P-type silicon semiconductor substrate is used for making an N-channel MOS transistor with fine element isolation regions.

Figure 1A:
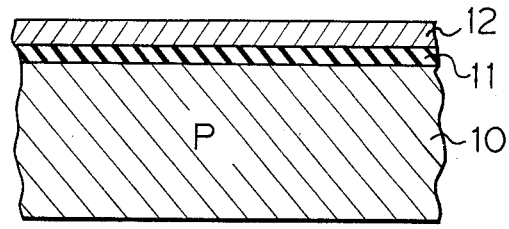
FIGS. 1a to 1c are sectional views showing prior art steps of making a semiconductor device by a selective oxidation process.
Figure 1B:
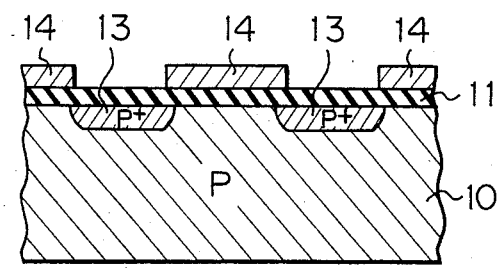
Figure 1C:
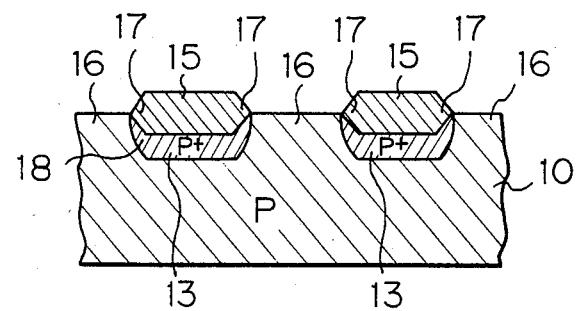
Figure 2A:
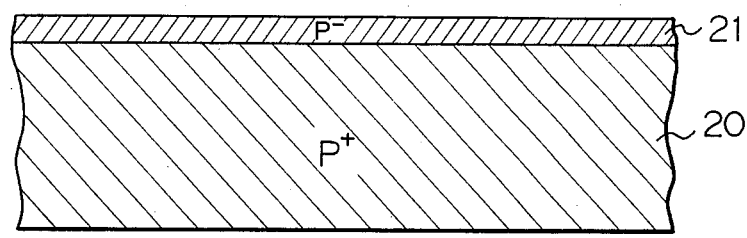
FIGS. 2a to 2e are sectional views showing steps of making a semiconductor device according to this invention.

First, in FIG. 2a, a heavily doped P-type silicon substrate 20 having an impurity concentration of about $1 \times 10^{18}$ atoms cm$^{-3}$ is prepared. A lightly doped P-type silicon layer 21 having an impurity concentration of $1 \times 10^{14}$ to $1 \times 10^{16}$ atoms cm$^{-3}$ is epitaxially grown on the entire surface of the substrate 20. The thickness of the epitaxial layer 21 is determined such that the impurities out-diffused from the silicon substrate 20 by subsequent heating processes do not effect on the properties of the epitaxial layer 21, and is preferably about 1.7 $\mu$m.

Figure 2B:
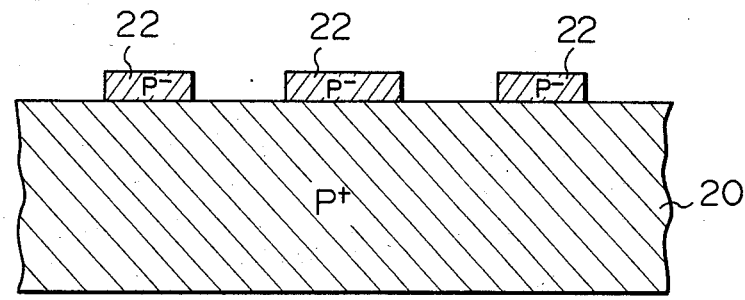

Next, the epitaxial layer 21 is selectively removed by a reactive ion etching process to form islands 22 acting as active regions (see FIG. 2b) The islands 22 may be spaced to a minimum value obtained by conventional IC photo lithography.

Figure 2C:
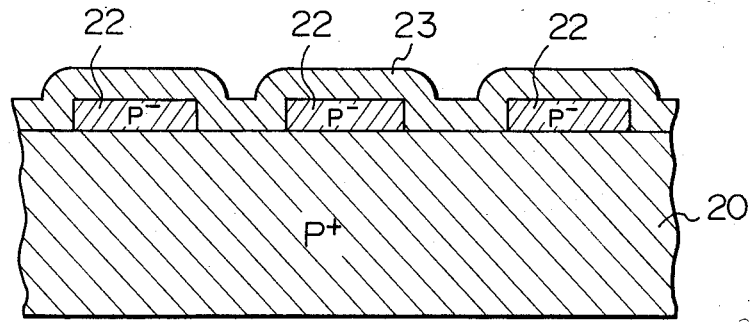

Thereafter, a silicon dioxide film 23 is formed on the entire surface of the structure obtained above by a chemical vapor deposition (CVD) process, being substantially similar to that of the epitaxial layer 21 in thickness (see FIG. 2c).

Figure 2D:
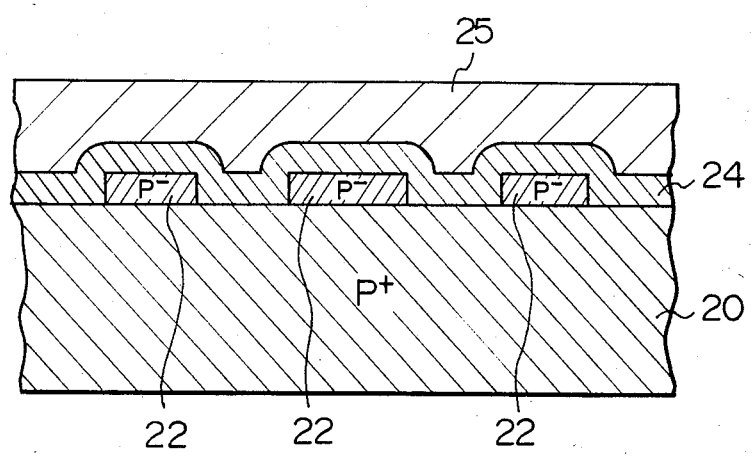

Next, a high-molecular material, for example, polyimide resin is applied on the entire surface of the CVD silicon dioxide film 24 to a thickness of 1 to 10 $\mu$m by a spinner so as to obtain a flat surface of the high-molecular material layer 25 (see FIG. 2d). Then, the polyimide resin layer 25 is cured in an atmosphere of nitrogen at about 300° C. for about 30 minutes.

Figure 2E:
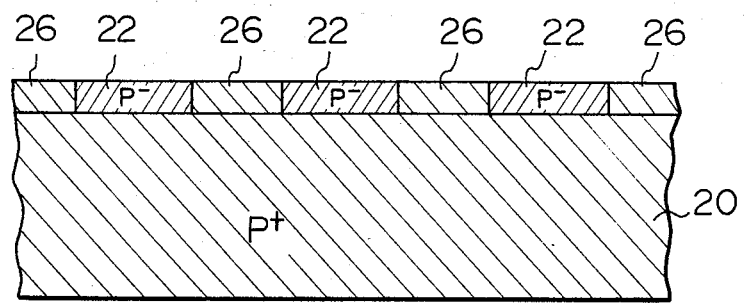

The structure obtained above is subjected to a reactive ion etching process in an atmosphere of flourine containing 1–10% oxygen by volume. In this condition, the CVD silicon dioxide film 24 and the polyimide resin film 25 are uniformly removed till the surfaces of the active regions 22 are exposed so as to obtain a flat surface of P-type active regions 22 and element isolation regions 26 (see FIG. 2e).

Thereafter, by using conventional IC manufacturing processes, MOS transistors are formed in the active regions 22.

As described above, according to this invention, since the heavily doped semiconductor substrate acts as a portion of an element isolation region, no channel stop regions are required under field isolation regions, thus decreasing the number of IC manufacturing steps. Also, since the field isolation regions have no bird's beak regions, active regions can be miniaturized to produce high density IC devices. Furthermore, since semiconductor devices according to this invention have flat surfaces, the breakage of conductive layers for interconnections can be decreased to improve the yield of the semiconductor devices.

This invention is applicable to bipolar semiconductor IC devices.

What is claimed is:

1. A method of making MOS semiconductor devices comprising the steps of:
    preparing a single crystalline silicon substrate of one conductivity type which is in a high impurity concentration;
    forming on the surface of said silicon substrate a silicon epitaxial layer having the same conductivity type as that of said silicon substrate in a low impurity concentration;
    etching off selected regions of said silicon epitaxial layer so as to form islands of said silicon epitaxial layer;
    forming a silicon oxide layer all over the surface of the structure obtained by said steps;
    applying a high-molecular material film all over the surface of said silicon oxide layer;
    curing said high-molecular material film; and
    removing both said silicon oxide layer and said high-molecular material film so as to expose surfaces of said islands, whereby fine dielectric element isolation regions of said silicon oxide layer are obtained between said islands.

2. A method as claimed in claim 1, wherein said silicon substrate is of P-type conductivity, said epitaxial is of P-type conductivity, and said high-molecular material film is a polyimide resin film.

3. A method as claimed in claim 2 wherein said single crystalline silicon layer has an impurity concentration of about $1 \times 10^{18}$ atoms cm$^{-3}$, said P-type epitaxially grown silicon layer has an impurity concentration of $1 \times 10^{14}$ atoms cm$^{-3}$ to $1 \times 10^{16}$ atoms cm$^{-3}$ and is about 1.7 $\mu$m in thickness, and said polyimide resin film is 1 to 10 $\mu$m in thickness.

4. A method as claimed in claim 3 wherein said step of removing both said silicon oxide layer and said high-molecular material film is carried out by a dry etching process.

5. A method as claimed in claim 4 wherein said dry etching process is carried out in a mixture of a fluorine gas and 1–10% oxygen gas by volume.

6. A method as claimed in claim 2 further comprising the steps of forming MOS transistor elements in said island regions of said epitaxial layer.

* * * * *